United States Patent

[11] 3,571,754

[72] Inventors Daniel J. Healey, III;
Michael M. Driscoll, Baltimore, Md.
[21] Appl. No. 786,609
[22] Filed Dec. 24, 1968
[45] Patented Mar. 23, 1971
[73] Assignee Westinghouse Electric Corporation
Pittsburgh, Pa.

[54] WIDE DEVIATION VOLTAGE CONTROLLED CRYSTAL OSCILLATOR
12 Claims, 10 Drawing Figs.

[52] U.S. Cl. .......... 331/116, 331/74, 331/159, 331/177
[51] Int. Cl. .......... H03b 5/36
[50] Field of Search .......... 331/116, 177 (V), 158, 159, 164, 74

[56] References Cited
UNITED STATES PATENTS
3,358,244 12/1967 Ho et al. .......... 331/116
3,382,462 5/1968 Davis .......... 331/177(V)
3,382,463 5/1968 Hurtig .......... 331/177(V)

*Primary Examiner*—John Kominski
*Assistant Examiner*—Siegfried H. Grimm
*Attorneys*—F. H. Henson, E. P. Klipfel and J. L. Wiegreffe

ABSTRACT: A variable frequency harmonic oscillator including a voltage tunable crystal controlled resonator incorporating a quartz crystal unit with precisely antiresonated (neutralized) static capacitance operating substantially at the series resonant frequency of the quartz crystal as opposed to the antiresonant frequency thereof and a voltage variable reactance network coupled thereto having a linear reactance vs. voltage characteristic, the coupling being by means of a reactive transformer, two elements of which are absorbed in combination with elements of the neutralized crystal and variable reactance networks. Additionally a maintaining circuit is coupled to the resonator forming an oscillator thereby and including a circuit providing a means for suppressing spurious oscillations at undesired frequencies below the desired frequency band of operation.

INVENTORS
DANIEL J. HEALEY, III
MICHAEL M. DRISCOLL
BY Ernest P. Klipfel
ATTORNEY

INVENTORS
DANIEL J. HEALEY, III
MICHAEL M. DRISCOLL

BY Ernest P. Klipfel
ATTORNEY

WIDE DEVIATION VOLTAGE CONTROLLED CRYSTAL OSCILLATOR

The invention herein described was made in the course of or under a contract with the U.S. Navy, Naval Air Systems Command—Contract NOw 66–0138.

BACKGROUND OF THE INVENTION

A voltage controlled crystal oscillator, referred to hereinafter as a VCXO, is a harmonic oscillator the frequency determining portion of which comprises a quartz crystal unit in combination with fixed reactive elements and a voltage variable reactance.

The VCXO has become of great importance as a component for signal processing circuitry in modern radar sets which utilizes phase information in the received signals. Although not limited thereto, a typical use for the VCXO in such apparatus exists where the VCXO comprises a tunable beating oscillator tunable over a frequency range that may be between 10 and 50 kHz., depending on the radar-transmitted frequency band. Such VCXO's are employed to permit removal of large undesired signals commonly referred to as clutter in the receiving apparatus at the low level amplifying stages of the first or second IF amplifiers so that reception of signals smaller than the undersired signal and separated in frequency from it by only 500 to 1000 Hz. can be detected without sensitivity degradation. This is accomplished by utilizing the VCXO to heterodyne the undesired received signals to the rejection band of a multisection crystal band elimination filter. Other uses include a modulated signal source for angle modulating (FM) the radar transmitted carrier frequency for purposes of range measurements. It may also be utilized as the tunable beating signal source which must be tunable over a band of approximately 100 kHz. for purposes of frequency tracking a desired signal with a narrow band electronic frequency control loop. Still other uses to which the VCXO may be put is in telemetry applications, vehicular UHF and microwave SSB communications systems, amateur radio service and in FM exciters for television transmitters and FM vehicular radio systems.

Although crystal controlled oscillators are well known to those skilled in the art, only recent developments have produced variable frequency crystal oscillators and still more recently has the voltage controlled crystal oscillator utilizing a voltage variable reactance element such as a varactor diode appeared. One such example of the latter is taught by U.S. Pat. No. 3,256,498 issued to C. R. Hurtig. This patent describes an oscillator in which a piezoelectric crystal element is coupled to the output electrode of a single transistor amplifier, and operates preferentially at the antiresonant frequency of the crystal element. A capacitor is shunted across the crystal and a series inductor is connected in combination therewith to partially neutralize the effective shunt capacitance of the crystal. A voltage variable capacitance diode is disposed in parallel relationship to the crystal load circuit and operates to cause deviations from the resonant frequency of oscillation as determined primarily by the crystal. Although such a circuit operates generally in a desired manner, it does not provide long and short term frequency stability requirements that will be demanded of such devices in future radar applications.

SUMMARY

It is the object of the present invention to provide an improved voltage controlled crystal oscillator having relatively wide frequency deviation with increased frequency stability and greater reduction in oscillator phase noise which has heretofore been unobtainable.

The present invention comprises a tunable crystal resonator and a maintaining circuit wherein the resonator circuit includes a piezoelectric quartz crystal unit with operation substantially at the series resonant frequency of said crystal unit. The static capacitance of the crystal unit is neutralized by antiresonating it precisely at the series resonant frequency of the crystal by addition of appropriate value of parallel inductance so that the impedance of the crystal with associated parallel inductance will exhibit a reactance vs. frequency characteristic that is extremely linear over the frequency band of interest. A varactor diode circuit comprising at least one voltage variable capacitance diode is connected in parallel combination with an inductor having predetermined value of inductive reactance necessary so that the resulting reactance vs. voltage characteristic of the parallel combination can be matched to an ideal linear characteristic at three points over the range of voltage applied to the diode(s). Secondly, another inductor, having predetermined value of inductive reactance to enable the VCXO to be tuned directly through the quartz crystal unit series resonant frequency, is placed in series with the combination of varactor diode(s) and parallel inductance for connection to the quartz crystal unit with neutralized static capacitance. The series inductor is replaced using a well known network theorem by an impedance matching network consisting of three synthesized elements in pi circuit configuration the series arm of which is a capacitor and the shunt arms of which are inductors that are absorbed by combination with elements of the neutralized crystal and variable reactance diode networks. The use of the network impedance transformation theorem results in the use of inductors that can be realized in practice as stable, low loss elements. The two stage maintaining circuit is coupled to the voltage variable resonator circuit and additionally includes feedback means comprising a tickler circuit whereby a tickler oscillator results. Additionally, the feedback circuit includes a spurious frequency suppression network which prevents oscillation at frequencies other than the desired frequency while simultaneously not introducing excessive phase delay at the desired frequency band of interest.

DESCRIPTION OF THE PREFERRED EMBODIMENTS

Figures 1, 2, 3, 4, 5, 6:
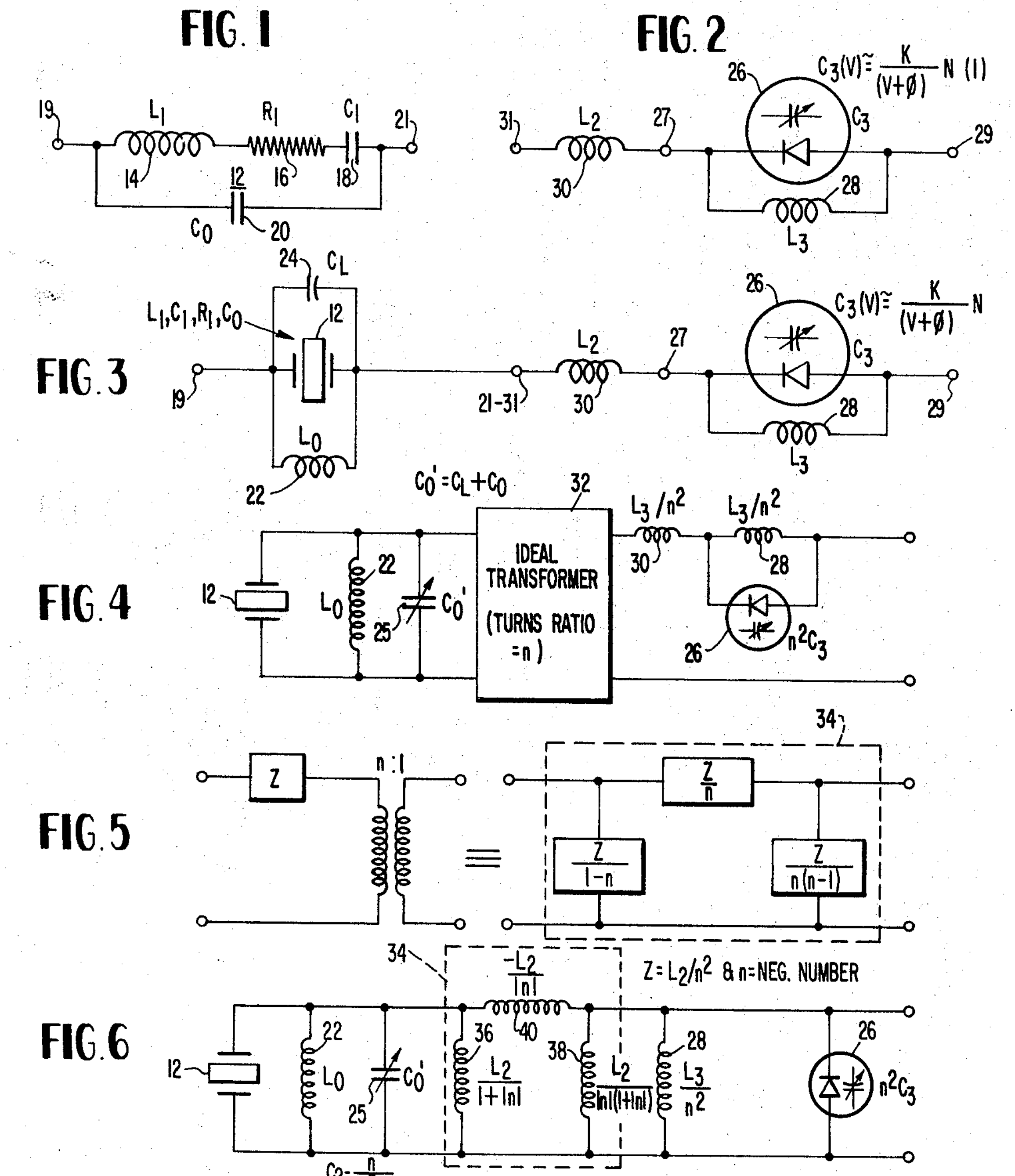
FIG. 1 is an electrical schematic diagram of the electrical equivalent circuit which is descriptive of the performance of high frequency piezoelectric quartz crystal units.
FIG. 2 is an electrical schematic diagram of a varactor diode circuit which provides a reactance vs. voltage characteristic that can be matched to an ideal linear characteristic at three points over the range of voltage applied to the diode.
FIG. 3 is an electrical circuit diagram of a piezoelectric quartz crystal unit with neutralized static capacitance coupled to the varactor diode network shown in FIG. 2 in a conventional manner for providing a voltage variable crystal controlled resonator circuit.
FIG. 4 is an electrical schematic diagram illustrative of a network impedance transformation for coupling the piezoelectric crystal network to the varactor diode network shown in FIG. 3.
FIG. 5 is illustrative of a network transformation theorem contemplated by the subject invention.
FIG. 6 is a schematic diagram illustrating the electrical circuit resulting from application of the network transformation theorem shown in FIGS. 5 to $L_2$ in FIG. 3.

Referring not to the figures and more particularly to FIG. 1, there is disclosed an equivalent circuit of a piezoelectric crystal generally referred to by reference number 12 and is shown comprising the series RLC combination of the inductor 14, the resistor 16 and capacitor 18 paralleled by the capacitor 20. Each of these elements have a value of $L_1$, $R_1$, $C_1$, and $C_0$ respectively. The capacitance 20 moreover, represents the static capacitance of the crystal 12. For maximum frequency stability, the crystal 12 must be operated substantially at its series resonant frequency and not as taught by the noted prior art wherein operation is substantially at the antiresonance (parallel resonance) frequency of said crystal unit. Pursuant to this end the static capacitance 20, having a value of $C_0$ is precisely neutralized at the crystal unit series resonant frequency. This is accomplished by means of an inductor 22 having value of inductance $L_0$ placed in parallel connection with the crystal unit 12 as shown in FIG. 3. Because the value of static capacitance $C_0$ is comparatively small and changes from unit to unit and because of typical manufacturing tolerances on inductor 22, a variable trimmer capacitor 24 is also coupled across the crystal unit 12, and $L_0$ is chosen so that adjustment of the trimmer capacitance $C_L$ results in exact neutralization of $C_0$ at the series resonant frequency of the crystal 12. Additionally, a substantially linear reactance vs. frequency characteristic is thereby achieved between the terminals 19 and 21 over the frequency band of interest. Stated another way the reactive portion of the impedance existing between terminals 19 and 21 in the vicinity of the crystal unit series resonant frequency varies linearly from a negative value of reactance ($-jX$) below said resonant frequency to a positive value of reactance ($+jX$) above said resonant frequency, it being understood that the frequency wherein the reactance component is zero comprises the series resonant frequency of the crystal unit.

A voltage tunable resonator is provided by connection of a voltage variable reactance to the crystal circuitry comprising the piezoelectric quartz crystal 12, the inductor 22 and the trimmer capacitor 24 as shown in FIG. 3. Such a reactance is disclosed in FIG. 2 wherein a varactor diode 26 having a value $C_3$ is shunted by means of an inductor 28 having value of inductance $L_3$. A varactor diode is a semiconductor device which exhibits a capacitive reactance characteristic which is variable in accordance with the voltage appearing across the terminals thereof. For example the characteristic can be described by the following expression which neglects the static capacitance of the diode:

$$C(V)\cong\frac{K}{(V+\phi)nN}$$

where $K$=constant, $V$=applied voltage, $\Phi$=junction contact potential, and $N\cong 0.5$ for abrupt junction varactor diodes. By connecting the inductor 28 having predetermined value $L_3$ across the terminals 27 and 29 of the varactor diode 26, a reactance vs. voltage characteristic is produced thereacross that matches an ideal linear characteristic at three points over the desired range of applied tuning voltage with the deviations from a linear characteristic less than ±0.1 percent. The substantially linear reactance vs. voltage characteristic of the varactor diode 26 shunted by the inductor 28, on the other hand, exhibits a net value of negative reactance over the linear region of the reactance vs. voltage characteristic. However, by the inclusion of a series inductor 30 having a predetermined value of inductance $L_2$ between terminals 31 and 27, a reactance vs. voltage characteristic is provided across terminals 31 and 29 which exhibits a net zero reactance value at the center of the linear portion of the reactance vs. voltage characteristic so that over the range of required tuning voltage said reactance vs. voltage characteristic becomes substantially a mirror image of the linear reactance vs. frequency characteristic exhibited over the required frequency tuning band by the crystal network connected between terminals 19 and 21.

It becomes evident that a tunable crystal controlled resonator circuit having substantially linear resonant frequency vs. voltage characteristic and operating substantially at the series resonant frequency of the piezoelectric quartz crystal unit would result form the connection of the crystal 12 with neutralized static capacitance 20 to the variable reactance network shown in FIG. 2. This connection is depicted in FIG. 3. In order to obtain desired operation of the circuit of FIG. 3 over a relatively large tuning range the values required for $L_3$ and $L_2$ become undesirably large. This situation results from the limited range of motional parameters ($L_1$, $R_1$, $C_1$) for which crystal units having controlled anharmonic responses can be manufactured. Although the circuit as shown in FIG. 3 can be made operable, the frequency stability that can be realized from such a configuration is poor due to the required high impedance levels and associated increased losses and undesirable effects of distributed capacitance of the elements to a point of reference potential such as ground.

Inasmuch as the primary object of the present invention is to obtain increased frequency stability over apparatus presently known to those skilled in the art, it becomes necessary to reduce the impedance level of the inductors 28 and 30 to a level wherein components having comparatively high stability and low losses can be utilized while at the same time matching the reactance vs. voltage characteristic obtained from the use of inductors 28 and 30 and varactor diode 26 to the comparatively high impedance characteristic of the crystal 12 with associated neutralized static capacitance $C_0$. This can be done by means of an electrical impedance transformer coupled between the crystal and varactor diode networks of FIG. 3 which are shown connected between terminals 19 and 21 and between terminals 31 and 29 respectively. One such example is shown in FIG. 4 wherein the crystal 12 is shunted by a parallel equivalent capacitor 25 having a value $C_0'$ which is the summed combination of $C_L$ and $C_0$ in FIG. 3 and a parallel inductor 22 having a value of inductance $L_0$. These components are coupled for the sake of illustration by an ideal transformer 32 having an effective turns ratio of $n$ to the varactor diode 26 and the inductors 28 and 30. By reducing the values of the inductors 28 and 30 to $L_3/n^2$ and $L_2/n^2$ respectively, while increasing the capacitance of the varactor diode 26 to a value of $n^2C_3$, the impedance level of each of these elements has been reduced by a factor $N^2$ and is reflected by means of the ideal transformer 22 to the crystal network comprising crystal unit 12, shunt inductor 22 and shunt capacitor 25 which in effect "sees" the same impedance as it would in a circuit as shown in FIG. 3.

By utilizing a circuit shown by FIG. 4 with the inductance values scaled down to a level where stable low loss components are realizable the desired result of an extremely stable tunable crystal controlled resonator becomes feasible. There is just one further problem however, in that a transformer having adequate long term stability must be configured so that desired operation of the circuit as described in FIG. 4 can be obtained. A two winding transformer might be used, absorbing $L_0$ as the self inductance of one of the windings but it is doubtful that the leakage reactance would exhibit adequate long term stability. It should also be noted that the wide deviation VCXO resonator circuit shown in FIG. 4 incorporates three inductors 22, 30, and 28. The problem of arrangement of three inductors so as to minimize and stabilize the coupling coefficient between them in a compactly constructed resonator would require extreme mechanical stability.

The only practical means of implementing the impedance transformer concept disclosed by the configuration of FIG. 4 without stability degradation is by the use of a reactive matching network. Such a network is shown in FIG. 5 which depicts schematically a network equivalence theorem given by Norton. This theorem indicates that an impedance $Z$ coupled to an ideal transformer having an effective turns ratio $n$ is equivalent to a pi network having shunt impedance arms of $Z/1-n$ and $Z/n(n-1)$ and a series impedance arm of $Z/n$. This transformation is well known to those skilled in the art of electric wave filter design having been disclosed in U.S. Pat. 1,681,554 issued to E. L. Norton. It is also disclosed in Simplified Modern Filter Design, by Geffe, John F. Rider Publications, 1963 at page 33, and the Handbook of Filter Synthesis, A. Zverev, John Wiley and Sons, 1967 at page 530.

Application of the network equivalence theorem depicted in FIG. 5 to the series inductor 30 having inductance value $L_2$ in FIG. 3 in order to implement the concept illustrated in FIG. 4 results in the circuit shown in FIG. 6 where $Z$ in FIG. 5 is made equal to the inductive reactance of inductor 30 shown in FIG. 3 and $n$ is made equal to a negative number. The resulting pi network 34 shown in FIG. 6 includes the shunt inductors 36 and 38 and the series inductor 40. The shunt inductor 36 has a value of inductance equal to $L_2/1+|n|$ while the other shunt inductor has a value of inductance equal to $$L_2/|n|(1+|n|)$$

where $|n|$ is the absolute value of $n$. The series inductor included in the pi network on the other hand resulting from choice of $n$ being a negative number, has a value of inductance equal to $-L_2/|n|$ Because the frequency band of operation of the VCXO contemplated by the subject invention is small the requirement for a negative inductance $-L_2/|n|$ is satisfied by the use of a capacitor 42 shown in FIG. 7 having a value of capacitance $C_2$ which is equal to $n/\omega_s 2L_2$ wherein $\omega_s$ is the series resonant frequency of the quartz crystal unit.

Figure 7:
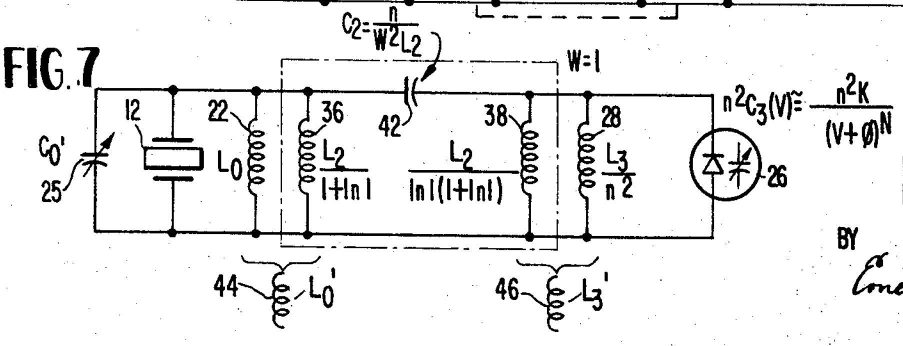
FIG. 7 is a schematic diagram illustrative of a circuit resulting when a capacitor having appropriate value of negative reactance is substituted for the "negative" inductor shown in FIG. 6.

With reference to FIG. 7 it immediately becomes evident that the parallel inductors 22 and 36 can be combined into a single inductor 44 having a value of inductance $L_o'$ which is equal to the parallel combined values thereof. Also the parallel inductors 38 and 28 can be combined into a single inductor 46 having a value of inductance $L_3'$ which is equal to the parallel combined values of inductors 38 and 28.

It should be pointed out that by choosing the value of $n$ to be a positive number for certain values of $n$ the resulting circuit would contain three inductors as shown in FIG. 6 with inductor 40 a positive real inductance. By choosing $n$ to be a negative number, on the other hand, only two inductors are required regardless of the choice of $n$. This choice of a negative number for $n$ and the consequent removal thereof of one inductor from the circuit, removes a large portion of the mutual inductance in the network adding further to the frequency stability desired.

Figure 8:
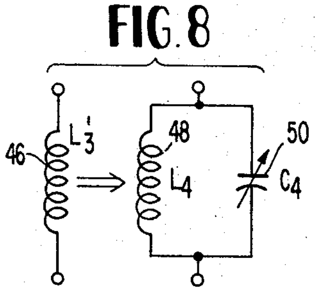
FIG. 8 is a circuit diagram illustrative of an equivalent impedance coupled across the varactor diode.

Proceeding now to FIG. 8, the resulting inductor 46 having a value of inductance $L_3'$ is replaced by a combination of a parallel inductor 48 and trimmer capacitor 50 so that the net inductive reactance exhibited by the parallel combination can be made equal to that exhibited by inductor 46 by proper adjustment of capacitor 50. The value of inductance of inductor 48 is equal to $L_4$ and is slightly less than $L_3'$. The value of capacitor 50 which is $C_4$ represents the distributed capacitance of the inductor 48 plus the static capacitance of the varactor diode 26 plus the capacitance of a trimmer capacitor employed to permit alignment of the circuit.

Figure 9:
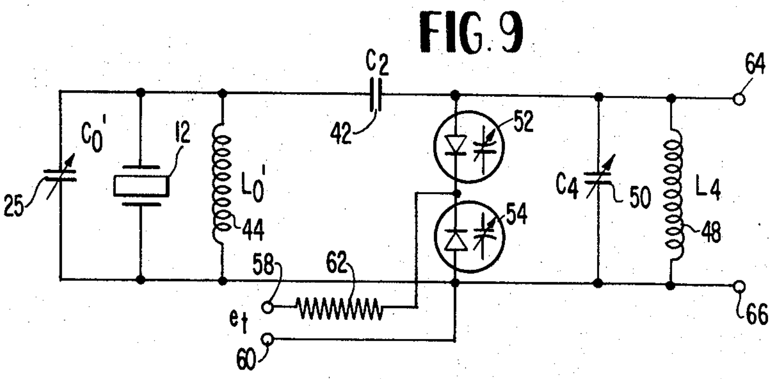
FIG. 9 is a circuit diagram illustrative of one embodiment of the resonator with the network transformation completed.

FIG. 9 represents one preferred embodiment of a voltage tunable crystal resonator resulting from application of a network equivalence theorem to the circuit of FIG. 3. The circuit of FIG. 9 is a composite configuration of crystal network having linear reactance vs. frequency characteristic over the frequency band of operation and a voltage variable reactance network having linear reactance vs. voltage characteristic over the range of applied tuning voltage coupled together with consequent removal of an inductor by means of a pi matching network partially included in the inductors 44 and 48 and the capacitor 42. Also in the embodiment shown in FIG. 9 the single varactor diode 26 in FIG. 7 is replaced by a pair of varactor diodes 52 and 54 coupled back-to-back across the parallel capacitor 50 and inductor 48. Also a tuning voltage $e_t$ is coupled across the terminals 58 and 60. The signal $e_t$ is applied to the common connection between the varactor diodes 52 and 54 by means of the resistor 62.

The synthesized values of the inductors 44 and 48 resulting from application of the Norton network transformation theorem comprise elements which can be realized as stable low loss components as opposed to the inductance values $L_2$ and $L_3$ of the circuit shown in FIG. 3. The embodiment of the tunable resonator circuit shown in FIG. 9 moreover exhibits zero susceptance across the terminals 64 and 66 at the resonant frequency of said circuit. This means that in order for the configuration shown in FIG. 9 to be coupled to a maintaining circuit for providing an oscillator, the resulting oscillator must be of the antiresonant or parallel resonance type.

Figure 10:
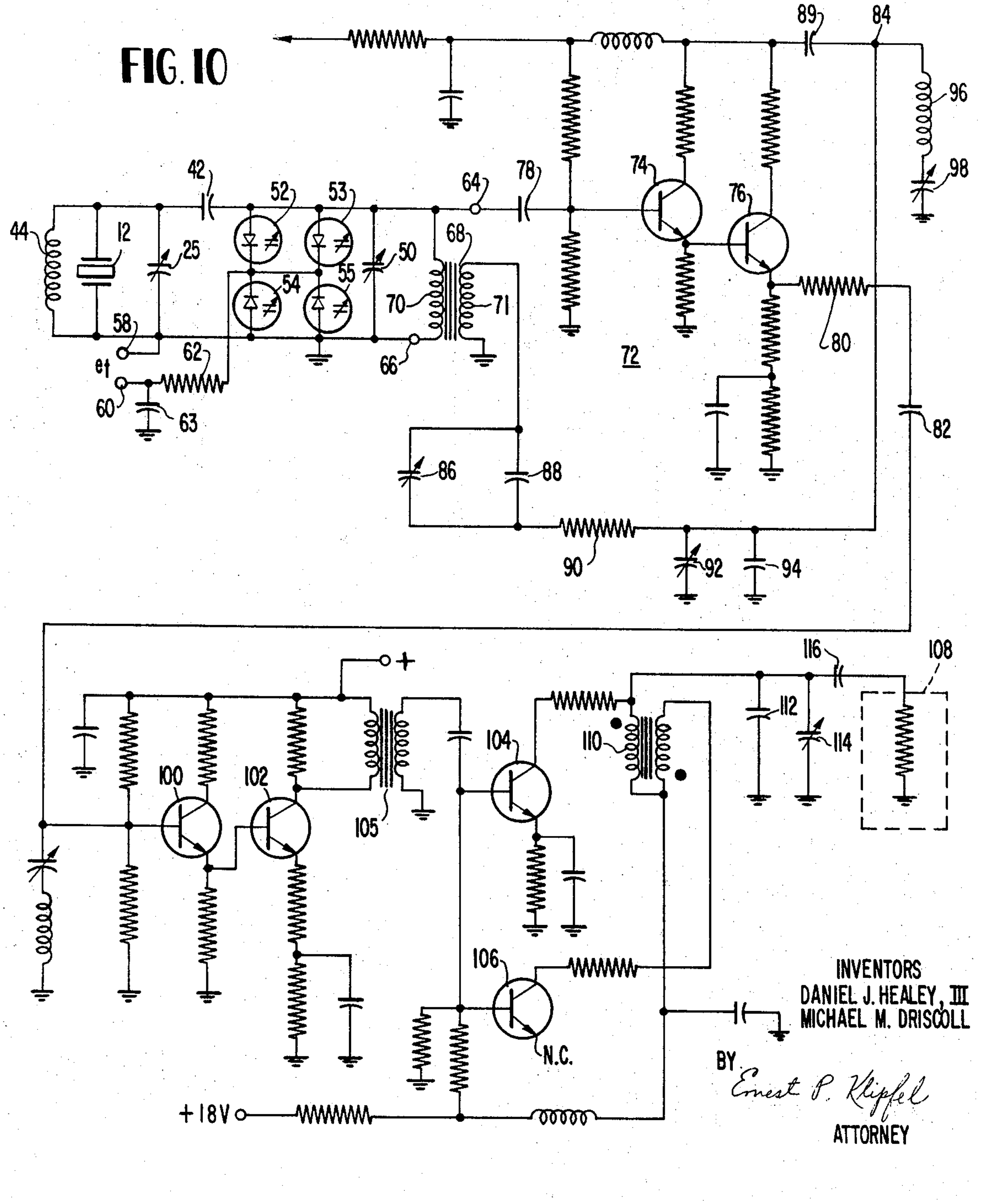
FIG. 10 is an electrical schematic diagram illustrative of the preferred embodiment of the subject invention including the resonator and maintaining circuits.

Proceeding now to FIG. 10 there is disclosed an oscillator circuit incorporating the resonator circuit shown in FIG. 9 and is in all respects identical thereto with the exception that two additional varactor diodes 53 and 55 are coupled in parallel with the diodes 52 and 54 and the inductor 48 shown in FIG. 9 is replaced by a transformer 68 which exhibits an inductance $L_4$ across the secondary winding 70. The resonator circuit is coupled into a high input impedance maintaining circuit including a pair of NPN transistors 74 and 76 such that the base of transistor 74 is coupled to the output terminal 64 of the resonator by means of the coupling capacitor 78. The emitter of the transistor 74 is directly coupled to the base of transistor 76 and the oscillator signal output is coupled from the emitter of transistor 76 to succeeding buffer and power amplifier stages by means of the resistor 80 and the capacitor 82. The high input impedance of the circuit comprising transistors 74 and 76 prevents degradation of the stability of the resonator circuit due to external loading. A positive feedback path is obtained from the collector circuit of transistor 76 by means of the primary winding 71 of transformer 68 coupled back to the junction 84 by means of capacitors 86 and 88 and a frequency selective network for suppression of spurious oscillation at frequencies below the desired frequency band of operation. This network comprises resistor 90, the parallel capacitors 92 and 94, and the series combination of the inductor 96 and the variable capacitor 98. The feedback path thus provided with sustain oscillation at the desired frequency determined by the resonator circuit including the crystal 15 and the varactor diodes 52—55 and will discriminate against possible oscillation at frequencies below the desired frequency band where the resonator circuit shown in FIGS. 9 and 10 exhibits an unwanted or spurious resonance characteristic. The feedback circuit thus provided by the maintaining circuit 72 is referred to in the art as a tickler feedback circuit and the overall combination is referred to as a tickler feedback oscillator.

The oscillator output which appears at the emitter of transistor 76 is coupled to a buffer amplifier including transistors 100 and 102 by means of the series combination of the resistor 80 and the capacitor 82. The output of the second stage of the two stage buffer amplifier is coupled to an output amplifier comprising transistors 104 and 106 by means of the transformer 105. The amplified output produced therefrom is coupled to an external resistive load 108 by means of the transformer 110 and the capacitive coupling networks including the capacitors 112, 114, and 116.

What has been shown and described therefore is a composite voltage tunable frequency determining portion of an oscillator and an oscillator maintaining circuit of the antiresonant tickler feedback variety which provides wide deviation voltage controlled crystal oscillators (VCXO) of exceptionally low phase noise and excellent short term and long term stability characteristics.

While the present invention has been described with a certain degree of particularlity, it should be understood that the present disclosure has been made only by way of example and that numerous changes in the detail of the circuitry in the combination or arrangement of elements may be resorted to without departing from the spirit and scope of the invention.

I claim:

1. A voltage controlled crystal oscillator including a frequency determining circuit or resonator and a maintaining circuit coupled together to provide an oscillator wherein said resonator circuit comprises in combination:

a piezoelectric crystal element adapted to operate in the region on either side of its series resonant frequency and including first circuit means coupled thereto for neutralizing the static capacitance of said crystal element and providing a substantially linear reactance vs. frequency characteristic thereby in the vicinity of the series resonant frequency of said crystal unit:

voltage variable capacitance means including second circuit means coupled thereto for providing a substantially linear reactance vs. voltage characteristic over the range of tuning voltage applied to said voltage variable capacitance means and exhibiting a zero value of reactance at the center of said linear reactance vs. voltage characteristic; and a Norton impedance transforming network coupled between said piezoelectric crystal element and said voltage variable capacitance means whereby the impedance level of said second circuit means is reduced to include elements which can be realized in practice as stable low loss components for increasing the frequency stability of said resonator.

2. The invention as defined by claim 1 wherein said voltage variable capacitance means comprises at least one varactor diode and said impedance transforming network comprises a network having a first and second shunt impedance and a series impedance coupled therebetween.

3. The invention as defined in claim 2 wherein said first and second shunt impedance of said network comprises a first and second inductance and said series impedance comprises a capacitance.

4. The invention as defined by claim 3 and wherein said first circuit means comprises a third inductance coupled in parallel across said crystal element for precisely antiresonating the static capacitance of said crystal element, and additionally including means for coupling said crystal element and said third inductance across said first inductance.

5. The invention as defined by claim 4 wherein said first and said third inductances are integrated into a fourth inductance.

6. The invention as defined by claim 2 and additionally comprising a fifth inductance coupled in parallel across said at least one varactor diode, and a sixth inductance coupled in series to the parallel combination of at least one varactor diode and said fifth inductance.

7. The invention as defined by claim 6 wherein said sixth inductance is replaced by an impedance transforming network resulting from a Norton network equivalence theorem transformation including a first and a second shunt inductance and a series capacitance coupled therebetween, said impedance transforming network being coupled between said piezoelectric crystal element and said fifth inductance and said at least one varactor diode.

8. The invention as defined by claim 7 wherein said second circuit means includes means for coupling said fifth inductance and said at least one varactor diode across said second shunt inductance, and said first circuit means includes means for coupling said crystal element across said first inductance.

9. The invention as defined by claim 8 and additionally including a variable trimmer capacitor coupled across said first inductance.

10. The invention as defined by claim 7 wherein one shunt inductance of said first and second shunt inductance comprises a transformer including a primary and secondary winding, said secondary winding being coupled across said at least one varactor diode;

and wherein said maintaining circuit comprises a high input impedance amplifier means coupled to said resonator circuit, positive feedback circuit means coupled from said high input impedance amplifier to said primary winding of said transformer, and spurious frequency suppression network means coupled to said positive feedback circuit means.

11. The invention as defined by claim 10 wherein said spurious frequency suppression network comprises an RLC network for tuning said positive feedback circuit by means of a series combination of capacitor and an inductor and at least one capacitor coupled in parallel across said series combination.

12. The invention as defined by claim 10 wherein said at least one varactor diode comprises a pair of varactor diodes connected to a back-to-back configuration and additionally including means for coupling a control signal thereto.